(12) United States Patent
Kim et al.

(10) Patent No.: US 8,461,633 B2
(45) Date of Patent: Jun. 11, 2013

(54) THIN FILM TRANSISTOR AND MANUFACTURING METHOD THEREOF

(75) Inventors: Jeong-Hwan Kim, Yongin (KR); Joung-Keun Park, Yongin (KR); Jae-Hyuk Jang, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 196 days.

(21) Appl. No.: 13/052,971

(22) Filed: Mar. 21, 2011

(65) Prior Publication Data

US 2012/0097947 A1 Apr. 26, 2012

(30) Foreign Application Priority Data

Oct. 22, 2010 (KR) ........................ 10-2010-0103551

(51) Int. Cl.
*H01L 29/76* (2006.01)

(52) U.S. Cl.
USPC ........... 257/288; 438/158; 438/315; 438/334; 257/E29.291; 257/E29.294

(58) Field of Classification Search
USPC ........... 257/288, E29.291, E29.294, E21.404; 438/315, 334
See application file for complete search history.

(56) References Cited

U.S. PATENT DOCUMENTS

2008/0308811 A1 12/2008 Miyake et al.

FOREIGN PATENT DOCUMENTS

| JP | 06-077255 | 3/1994 |
| KR | 10-2005-0106244 | 11/2005 |
| KR | 10-2007-0051090 | 5/2007 |

*Primary Examiner* — Jarrett Stark
(74) *Attorney, Agent, or Firm* — Christie, Parker & Hale, LLP

(57) ABSTRACT

A thin film transistor includes a substrate; a gate electrode on the substrate; a gate insulating layer covering the gate electrode; a semiconductor layer corresponding to the gate electrode on the gate insulating layer; a protective layer covering the semiconductor layer and the gate insulating layer and having a source contact hole and a drain contact hole exposing a portion of the semiconductor layer; and a source electrode and a drain electrode on the protective layer and coupled to the semiconductor layer through the source contact hole and the drain contact hole, respectively, wherein the semiconductor layer has a source offset groove at a portion corresponding to the source contact hole of the protective layer.

24 Claims, 8 Drawing Sheets

THIN FILM TRANSISTOR AND MANUFACTURING METHOD THEREOF

CROSS-REFERENCE TO RELATED APPLICATION

This application claims priority to and the benefit of Korean Patent Application No. 10-2010-0103551 filed in the Korean Intellectual Property Office on Oct. 22, 2010, the entire content of which is incorporated herein by reference.

BACKGROUND

1. Field

The described technology relates generally to a thin film transistor and a manufacturing method thereof.

2. Description of Related Art

Generally, a thin film transistor includes a gate electrode, a semiconductor layer formed on the gate electrode and electrically insulated from the gate electrode by a gate insulating layer, and a source electrode and a drain electrode in contact with the semiconductor layer.

When the gate insulating layer of the thin film transistor is contaminated by a metal or a dopant, a leakage current or an off current (Ioff) can be generated. Although it would seem that a current would not flow since electrons do not move into the semiconductor layer when the thin film transistor is in the off state, a leakage current means that a current may flow in an off state, since electrons passing through the semiconductor layer exist.

To prevent the leakage current, an offset region where the gate electrode and the source electrode and drain electrode do not overlap may be formed in the semiconductor layer.

However, an on current (Ion) may be decreased by the offset region. Further, when the gate electrode overlaps the source electrode and the drain electrode such that the offset region may not be formed, an alignment error may be generated, and thereby the characteristics of the thin film transistor may be deteriorated.

The above information disclosed in this Background section is only for enhancement of understanding of the background of the described technology and therefore it may contain information that does not form the prior art that is already known in this country to a person of ordinary skill in the art.

SUMMARY

Embodiments of the present invention provide a thin film transistor and a manufacturing method thereof that is capable of forming an offset region.

A thin film transistor according to an exemplary embodiment includes a substrate; a gate electrode on the substrate; a gate insulating layer covering the gate electrode; a semiconductor layer corresponding to the gate electrode on the gate insulating layer; a protective layer covering the semiconductor layer and the gate insulating layer and having a source contact hole and a drain contact hole exposing a portion of the semiconductor layer; and a source electrode and a drain electrode on the protective layer and coupled to the semiconductor layer through the source contact hole and the drain contact hole, respectively, wherein the semiconductor layer has a source offset groove at a portion corresponding to the source contact hole of the protective layer.

The semiconductor layer may include a source region contacting the source electrode, a drain region contacting the drain electrode, and a channel region between the source region and the drain region, wherein the source offset groove separates the source region from the channel region.

The semiconductor layer may include a material selected from the group consisting of amorphous silicon, polysilicon, an oxide semiconductor, micro crystalline silicon, and laser crystallized silicon.

The source contact hole may expose the source region and the source offset groove of the semiconductor layer.

The source electrode may cover a portion of the source contact hole, and the drain electrode may cover at least a portion of the drain contact hole.

The width of the source offset groove may be in the range of 1 μm to 10 μm.

The semiconductor layer may further include a drain offset groove at a portion corresponding to the drain contact hole of the protective layer, the drain offset groove may separate the drain region from the channel region, and the drain contact hole may expose the drain region and the drain offset groove of the semiconductor layer.

The drain electrode may cover a portion of the drain contact hole, and the width of the drain offset groove may be in the range of 1 μm to 10 μm.

A method for manufacturing a thin film transistor according to an exemplary embodiment includes forming a gate electrode on a substrate; forming a gate insulating layer covering the gate electrode; forming a semiconductor layer on the gate insulating layer; forming a protective layer having a source contact hole and a drain contact hole exposing the semiconductor layer on the gate insulating layer and the semiconductor layer; forming a source electrode and a drain electrode coupled to the semiconductor layer through the source contact hole and the drain contact hole, respectively, on the protective layer; and etching the semiconductor layer exposed through the source contact hole to form a source offset groove.

The source electrode may cover a portion of the source contact hole, and the source offset groove may separate the source region from the channel region of the semiconductor layer.

The semiconductor layer exposed through the drain contact hole may be etched to form a drain offset groove while forming the source offset groove, and the drain electrode may cover a portion of the drain contact hole. The drain offset groove may separate the drain region from the channel region of the semiconductor layer.

A thin film transistor according to another embodiment of the present invention includes a substrate; at least one gate electrode on the substrate; a gate insulating layer covering the at least one gate electrode; a plurality of semiconductor layers corresponding to the at least one gate electrode on the gate insulating layer and separated from each other; a protective layer covering the plurality of semiconductor layers and the gate insulating layer and having a plurality of source contact holes and a plurality of drain contact holes exposing the plurality of semiconductor layers; and a plurality of source electrodes and a plurality of drain electrodes on the protective layer and coupled to the plurality of semiconductor layers through the plurality of source contact holes and the plurality of drain contact holes, wherein the plurality of semiconductor layers have a plurality of source offset grooves and a plurality of drain offset grooves at positions corresponding to the plurality of source contact holes and the plurality of drain contact holes, respectively, of the protective layer.

The plurality of source electrodes may be coupled to each other, and the plurality of drain electrodes may be coupled to each other.

A plurality of the at least one gate electrodes may include gate electrodes that are coupled to each other through a gate line.

Each of the plurality of semiconductor layers may include a source region contacting a corresponding one of the source electrodes, a drain region contacting a corresponding one of the drain electrodes, and a channel region between the source region and the drain region, wherein each of the source offset grooves separates the source region from the channel region, and each of the drain offset grooves separates the drain region from the channel region.

Each of the source contact holes may expose the source region and a corresponding one of the source offset grooves of a corresponding one of the semiconductor layers, and each of the drain contact holes may expose the drain region and a corresponding one of the drain offset grooves of the corresponding one of the semiconductor layers.

Each of the source electrodes may cover a portion of a corresponding one of the source contact holes, and each of the drain electrodes may cover a portion of a corresponding one of the drain contact holes.

According to an embodiment, the source offset groove formed between the source region and the channel region and the drain offset groove formed between the drain region and the channel region function as a source offset region and a drain offset region, respectively, such that the electron movement path of the semiconductor layer is blocked when the thin film transistor is in the off state, and the leakage current is thereby prevented.

Also, the exposed semiconductor layer may be etched while forming the source electrode and the drain electrode, to form the source offset groove and the drain offset groove such that the generation of the leakage current is suppressed. The source offset region and the drain offset region may be formed through a simple manufacturing process.

Further, a plurality of semiconductor layers, a plurality of source electrodes, and a plurality of drain electrodes may be formed on at least one gate electrode to amplify the on current such that the decreasing of the on current by the source offset groove and the drain offset groove may be reduced (or prevented).

DETAILED DESCRIPTION

Figure 1:
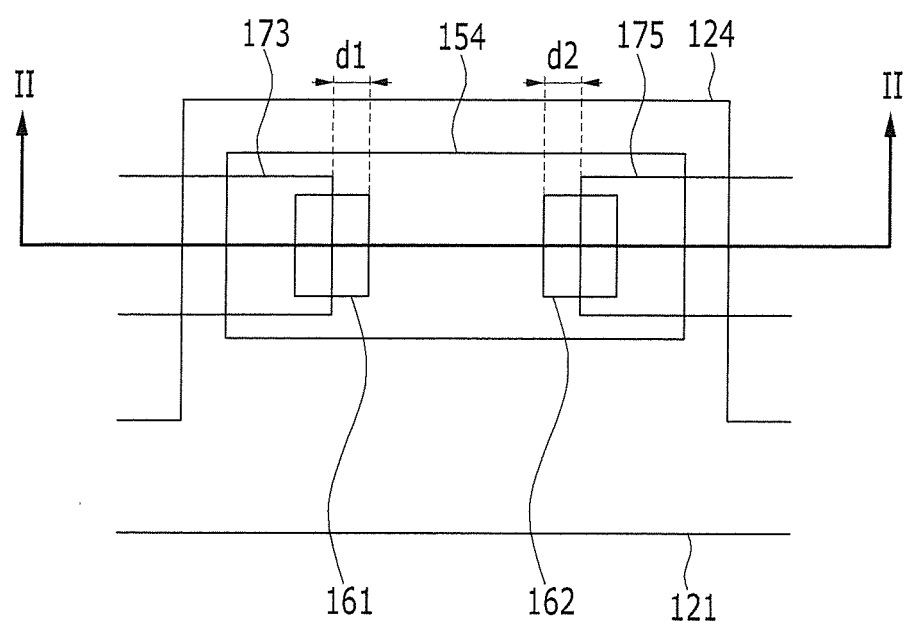
FIG. 1 is a layout view of a thin film transistor according to a first exemplary embodiment.

Hereinafter, several embodiments are shown and described in detail with reference to the accompanying drawings, to be performed by those skilled in the art. However, the present invention may be modified in various different ways and is not limited to embodiments described herein.

Further, in the embodiments, like reference numerals designate like elements throughout the specification, and representatively in a first embodiment, and only elements of a second embodiment other than those of the first embodiment will be described.

Descriptions of some of the parts not relating to the present invention are omitted, and like reference numerals designate like elements throughout the specification.

Further, since sizes and thicknesses of constituent members shown in the accompanying drawings are arbitrarily given for better understanding and ease of description, the present invention is not limited to the illustrated sizes and thicknesses.

In the drawings, the thickness of layers, films, panels, regions, etc., are exaggerated for clarity. It will be understood that when an element such as a layer, film, region, or substrate is referred to as being "on" another element, it can be directly on the other element or intervening elements may also be present.

Now, a thin film transistor according to a first exemplary embodiment will be described with reference to FIG. 1 and FIG. 2.

Figure 2:
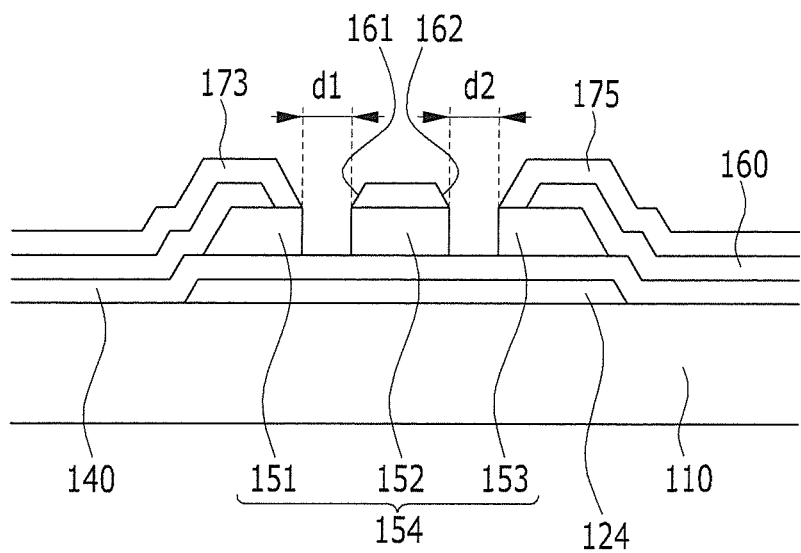
FIG. 2 is a cross-sectional view of the thin film transistor of FIG. 1 taken along the line II-II.

FIG. 1 is a layout view of a thin film transistor according to a first exemplary embodiment, and FIG. 2 is a cross-sectional view of the thin film transistor shown in FIG. 1 taken along the line II-II.

As shown in FIG. 1 and FIG. 2, in a thin film transistor according to the first exemplary embodiment, a gate electrode 124 is formed on a substrate 110 made of transparent glass or plastic. The gate electrode 124 transmits a gate signal and extends in a substantially transverse direction, thereby being connected to a gate line 121.

A gate insulating layer 140 made of silicon nitride ($SiN_x$) or silicon oxide ($SiO_x$) is formed on the gate electrode 124. The gate insulating layer 140 covers the gate electrode 124 for insulation.

A semiconductor layer 154 is formed on the gate insulating layer 140, and the semiconductor layer 154 overlaps the gate electrode 124. The semiconductor layer 154 may include a material selected from amorphous silicon (a-Si), polysilicon (poly-Si), an oxide semiconductor, microcrystalline silicon, or laser crystallized silicon.

The semiconductor layer 154 includes a source region 151, a drain region 153, and a channel region 152 positioned between the source region 151 and the drain region 153. A source offset groove d1 is formed between the source region 151 and the channel region 152 thereby separating (or dividing) the source region 151 from the channel region 152, and a drain offset groove d2 is formed between the drain region 153 and the channel region 152, thereby separating (or dividing) the drain region 153 from the channel region 152. As described above, the source offset groove d1 is formed between the source region 151 and the channel region 152, and the drain offset groove d2 is formed between the drain region 153 and the channel region 152 such that the source offset region and the drain offset region preventing a leakage current are formed. The source offset groove d1 and the drain offset groove d2 block the electron movement path in the semiconductor layer 154 when the thin film transistor is in an off state, such that the leakage current may be prevented.

The width of the source offset groove d1 may be in the range of 1 μm to 10 μm, and the width of the drain offset groove d2 may be in the range of 1 μm to 10 μm. When the widths of the source offset groove d1 and the drain offset groove d2 are less than 1 μm, a leakage current may be generated, and when the widths of the source offset groove d1 and the drain offset groove d2 are larger than 10 μm, the on current (Ion) may be decreased.

A protective layer 160 made of silicon nitride or silicon oxide is formed on the semiconductor layer 154 and the gate insulating layer 140. The protective layer 160 has a source contact hole 161 exposing the source region 151 and the source offset groove d1 of the semiconductor layer 154, and a drain contact hole 162 exposing the drain region 153 and the drain offset groove d2 of the semiconductor layer 154. The protective layer 160 may be used as an etch stop layer in a process of patterning a conductive layer to form a source electrode 173 and a drain electrode 175, thereby protecting the channel region 152 of the semiconductor layer 154.

A source electrode 173 in contact with the source region 151 of the semiconductor layer 154 through the source contact hole 161, and a drain electrode 175 in contact with the drain region 153 of the semiconductor layer 154 through the drain contact hole 162 are formed on the protective layer 160. The drain electrode 175 is opposite to the source electrode 173 with respect to the gate electrode 124. The source electrode 173 does not cover the all of the source contact hole 161, but only covers the source region 151 of the semiconductor layer 154 that is exposed through the source contact hole 161. The drain electrode 175 does not cover all of the drain contact hole 162, but only covers the drain region 153 of the semiconductor layer 154 that is exposed through the drain contact hole 162. Accordingly, the source offset groove d1 of the semiconductor layer 154 is exposed through a portion of the source contact hole 161, and the drain offset groove d2 of the semiconductor layer 154 is exposed through a portion of the drain contact hole 162.

Figure 3:
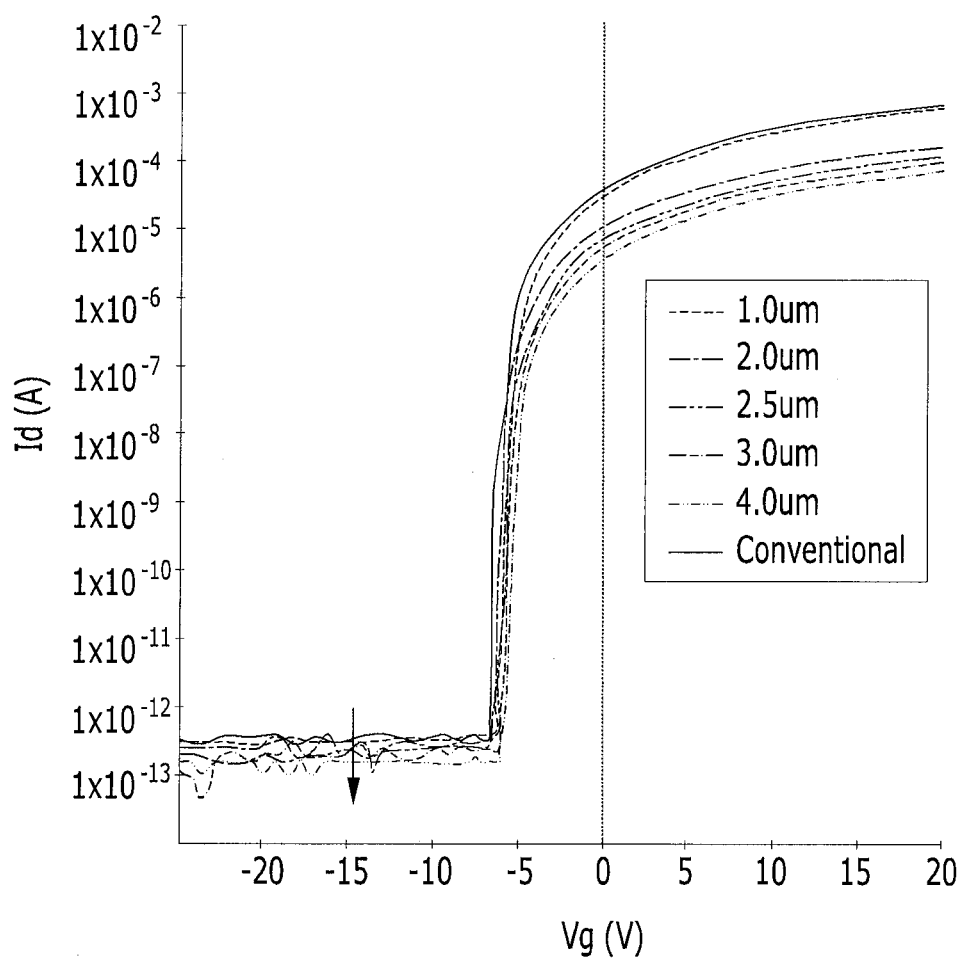
FIG. 3 is a graph showing a measured electrical characteristic of the thin film transistor shown in FIG. 1.

FIG. 3 is a graph showing a measured electric characteristic of the thin film transistor of FIG. 1. FIG. 3 shows changes in a drain current (or leakage current) (Id) according to different gate voltages (Vg) of the thin film transistor of FIG. 1.

As shown in FIG. 3, in a case of a conventional thin film transistor in which a source offset groove d1 or a drain offset groove d2 is not formed in the semiconductor layer 154, the leakage current is about $5 \times 10^{-13}$ A when the thin film transistor is in an off state. However, as the width of the source offset groove d1 or the drain offset groove d2 in the semiconductor layer 154 is increased from 1 μm to 4 μm, the leakage current is less than $5 \times 10^{-13}$ A.

As described above, the source offset groove d1 formed between the source region 151 and the channel region 152 and the drain offset groove d2 formed between the drain region 153 and the channel region 152 function as the source offset region and the drain offset region, respectively, such that the electron movement path in the semiconductor layer 154 is blocked when the thin film transistor is in the off state, thereby preventing a leakage current.

Next, a method for manufacturing the thin film transistor shown in FIG. 1 and FIG. 2 according to an exemplary embodiment will be described with reference to FIG. 2 and FIG. 4.

Figure 4:
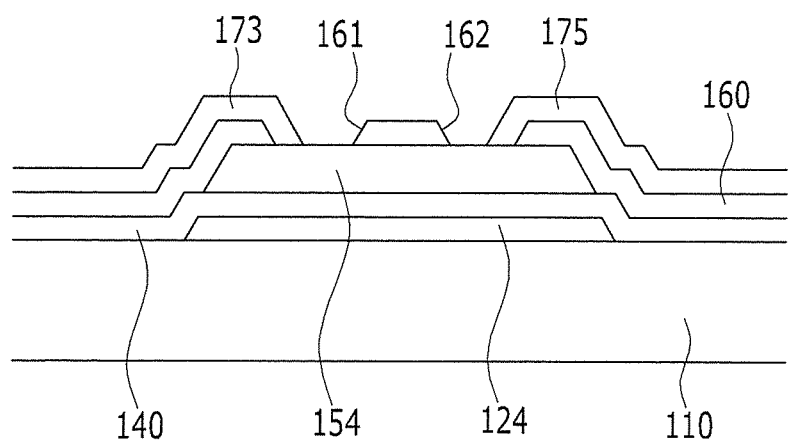
FIG. 4 is a cross-sectional view showing a step of forming a source electrode and a drain electrode according to a method of manufacturing the thin film transistor of FIG. 1.

FIG. 4 is a cross-sectional view showing a step of forming a source electrode and a drain electrode according to a method of manufacturing the thin film transistor of FIG. 1.

First, as shown in FIG. 4, a conductive layer is formed on a substrate 110 and is patterned to form a gate electrode 124. Next, a gate insulating layer 140 made of silicon nitride or silicon oxide is formed on the substrate 110 and the gate electrode 124. Then, a semiconductor layer 154 is formed on the gate insulating layer 140. The semiconductor layer 154 overlaps the gate electrode 124. Also, a protective layer 160 made of silicon nitride or silicon oxide is formed on the gate insulating layer 140 and the semiconductor layer 154. The protective layer 160 is patterned to form a source contact hole 161 and a drain contact hole 162 exposing the semiconductor layer 154. The source contact hole 161 exposes the source region 151 of the semiconductor layer 154, and the drain contact hole 162 exposes the drain region 153 of the semiconductor layer 154. A source electrode 173 and a drain electrode 175 that are respectively connected to the semiconductor layer 154 through the source contact hole 161 and the drain contact hole 162 are then formed on the protective layer 160. Here, the source electrode 173 covers a portion of the source contact hole 161, and the drain electrode 175 covers a portion of the drain contact hole 162. Accordingly, a portion of the semiconductor layer 154 exposed through the source contact hole 161 is covered by the source electrode 173, and a portion of the semiconductor layer 154 exposed through the drain contact hole 162 is covered by the drain electrode 175.

Next, as shown in FIG. 2, the portion of the semiconductor layer 154 exposed through the source contact hole 161 that is not covered by the source electrode 173 is etched to form a source offset groove d1, and simultaneously the portion of the semiconductor layer 154 exposed through the drain contact hole 162 that is not covered by the drain electrode 175 is etched to form a drain offset groove d2.

As described above, the exposed semiconductor layer 154 is etched when forming the source electrode 173 and the drain electrode 175 to form the source offset groove d1 and the drain offset groove d2, such that a source offset region and a drain offset region suppressing generation of a leakage current may be manufactured (e.g., through a simple manufacturing process).

While the source offset region and the drain offset region are both formed in the first exemplary embodiment, in other embodiments, only the source offset region may be formed to prevent the leakage current and to simultaneously improve the on current.

Next, a thin film transistor according to a second exemplary embodiment will be described with reference to FIG. 5 and FIG. 6.

Figure 5:
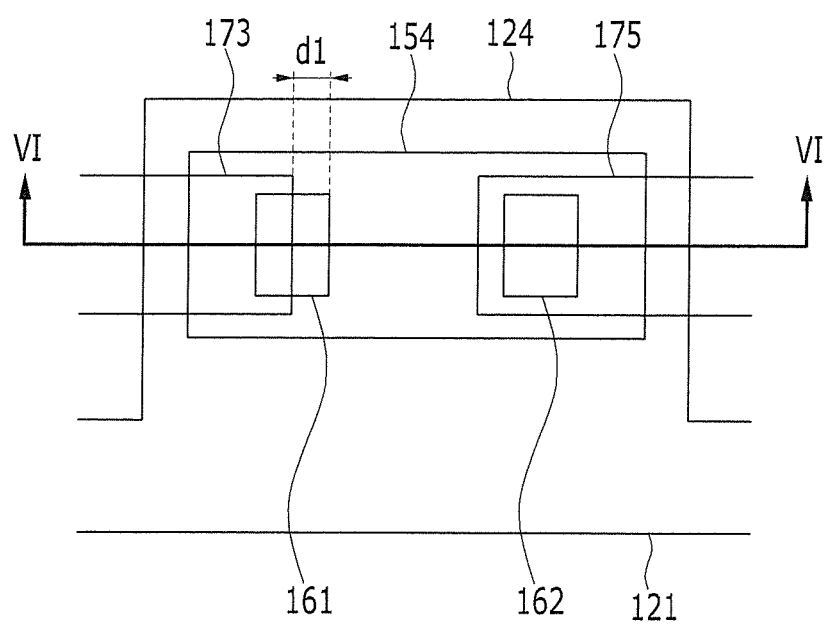
FIG. 5 is a layout view of a thin film transistor according to a second exemplary embodiment.
Figure 6:
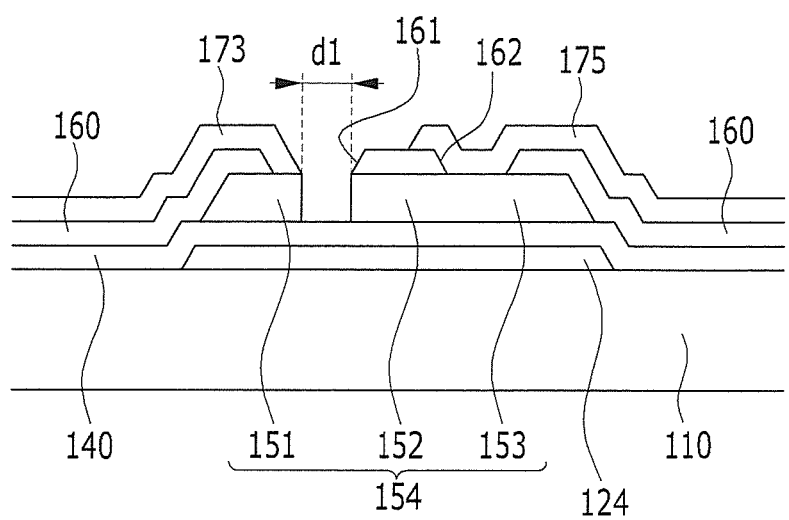
FIG. 6 is a cross-sectional view of the thin film transistor of FIG. 5 taken along the line VI-VI.

FIG. 5 is a layout view of a thin film transistor according to a second exemplary embodiment, and FIG. 6 is a cross-sectional view of the thin film transistor of FIG. 5 taken along the line VI-VI.

The second exemplary embodiment is substantially equivalent to the first exemplary embodiment shown in FIGS. 1 to 4, except that only a source offset region is formed. Accordingly, overlapping description is omitted. Also, in the first exemplary embodiment, the drain offset groove d2 acts as a resistor such that the on current may be improved.

As shown in FIG. 5 and FIG. 6, in a thin film transistor according to the second exemplary embodiment, a semiconductor layer 154 is formed on a gate insulating layer 140. The semiconductor layer 154 includes a source region 151, a drain region 153, and a channel region 152 positioned between the source region 151 and the drain region 153, and a source offset groove d1 is formed between the source region 151 and the channel region 152 such that source region 151 and the channel region 152 are separated (or divided). As described above, the source offset groove d1 is formed between the source region 151 and the channel region 152 such that a source offset region preventing the leakage current is formed. The source offset groove d1 blocks the electron movement path in the semiconductor layer 154 when the thin film transistor is in the off state, thereby preventing generation of a leakage current.

The width of the source offset groove d1 may be in the range of 1 μm to 10 μm. When the width of the source offset groove d1 is less than 1 μm, a leakage current may be generated (e.g., easily generated), and when the width of the source offset groove d1 is more than 10 μm, an on current (Ion) may be decreased.

A protective layer 160 made of silicon nitride or silicon oxide is formed on the semiconductor layer 154 and the gate insulating layer 140. The protective layer 160 has a source contact hole 161 exposing the source region 151 and the source offset groove d1 of the semiconductor layer 154, and a drain contact hole 162 exposing the drain region 153 of the semiconductor layer 154. A source electrode 173 and a drain electrode 175 are formed on the protective layer 160. The source electrode 173 contacts the source region 151 of the semiconductor layer 154 through the source contact hole 161 and the drain electrode 175 contacts the drain region 153 of the semiconductor layer 154 through the drain contact hole 162. The source electrode 173 does not cover the source contact hole 161, but only covers the source region 151 of the semiconductor layer 154 that is exposed through the source contact hole 161, and the drain electrode 175 covers the drain contact hole 162 such that the drain region 153 of the semiconductor layer 154 is not exposed.

Accordingly, the source offset groove d1 of the semiconductor layer 154 is completely exposed through a portion of the source contact hole 161.

While one semiconductor layer 154, one source electrode 173, and one drain electrode 175 are formed on one gate electrode 124 in the first exemplary embodiment, in other embodiments a plurality of semiconductor layers 154, a plurality of source electrodes 173, and a plurality of drain electrodes 175 may be formed on one gate electrode 124 to prevent the decreasing of the on current caused by the source offset groove d1 and the drain offset groove d2, and to amplify the on current. Next, a thin film transistor according to a third exemplary embodiment will be described with reference to FIG. 7.

Figure 7:
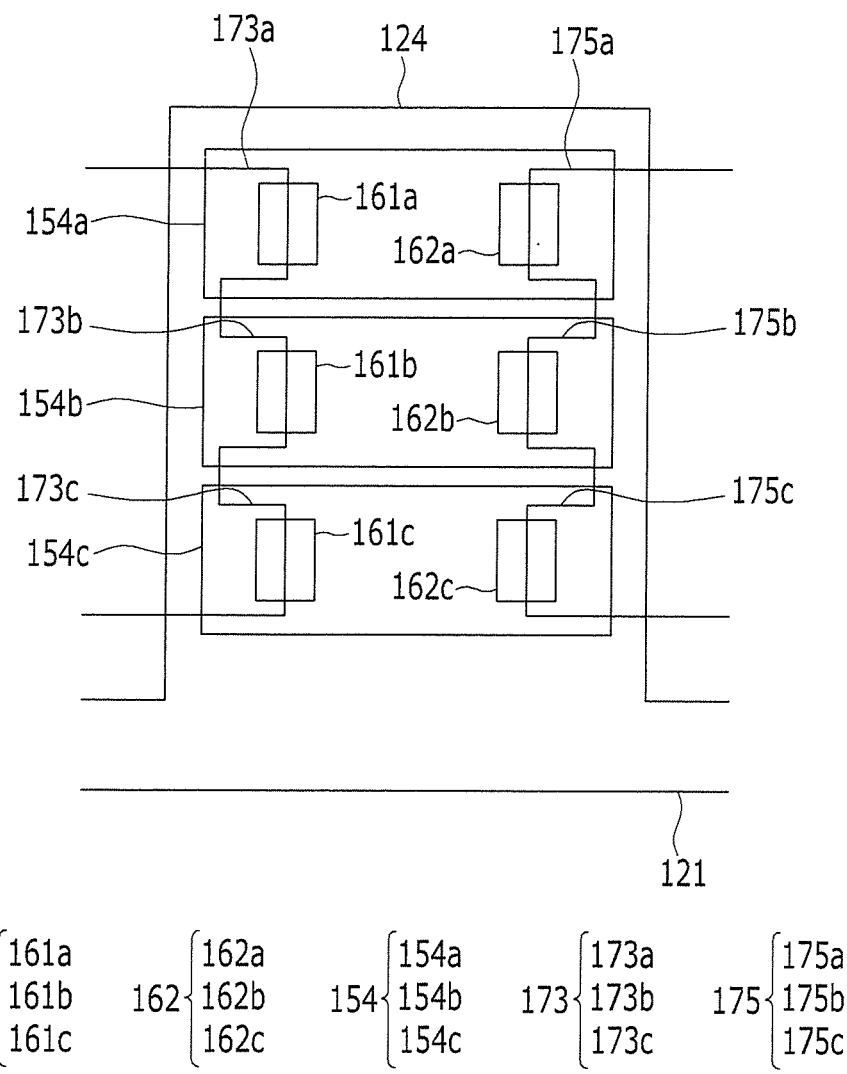
FIG. 7 is a layout view of a thin film transistor according to a third exemplary embodiment.

FIG. 7 is a layout view of a thin film transistor according to a third exemplary embodiment.

The third exemplary embodiment is substantially equivalent to the first exemplary embodiment shown in FIGS. 1 to 4, except that in the third exemplary embodiment, a plurality of semiconductor layers 154, a plurality of source electrodes 173, and a plurality of drain electrodes 175 are formed on one gate electrode 124.

As shown in FIG. 7, in a thin film transistor according to the third exemplary embodiment, a gate electrode 124 is formed on a substrate 110, a plurality of semiconductor layers 154 are formed on the gate electrode 124, and the plurality of semiconductor layers 154 overlap the gate electrode 124. The third exemplary embodiment shows three semiconductor layers, but more than three semiconductor layers is possible. The plurality of semiconductor layers 154 includes a first semiconductor layer 154a, a second semiconductor layer 154b, and a third semiconductor layer 154c that are separated from each other.

A protective layer 160 is formed on the first semiconductor layer 154a, the second semiconductor layer 154b, the third semiconductor layer 154c, and a gate insulating layer 140. The protective layer 160 has a plurality of source contact holes 161 exposing the source regions 151 and the source offset groove d1 of the plurality of semiconductor layers 154, and a plurality of drain contact holes 162 exposing the drain regions 153 and the drain offset grooves d2 of the plurality of semiconductor layers 154. In detail, the protective layer 160 has a first source contact hole 161a exposing the source region 151 and the source offset groove d1 of the first semiconductor layer 154a, and a first drain contact hole 162a exposing the drain region 153 and the drain offset groove d2 of the first semiconductor layer 154a. Also, the protective layer 160 has a second source contact hole 161b exposing the source region 151 and the source offset groove d1 of the second semiconductor layer 154b, and a second drain contact hole 162b exposing the drain region 153 and the drain offset groove d2 of the second semiconductor layer 154b. Further, the protective layer 160 has a third source contact hole 161c exposing the source region 151 and the source offset groove d1 of the third semiconductor layer 154c, and a third drain contact hole 162c exposing the drain region 153 and the drain offset groove d2 of the third semiconductor layer 154c.

A plurality of source electrodes 173 and a plurality of drain electrodes 175 are formed on the protective layer 160. The plurality of source electrodes 173 contact the source region 151 of a plurality of semiconductor layers 154 through a plurality of source contacts hole 161, and the plurality of drain electrodes 175 contact the drain region 153 of a plurality of semiconductor layers 154 through a plurality of drain contact holes 162. In detail, a first source electrode 173a contacts the source region 151 of the first semiconductor layer 154a through the first source contact hole 161a, and a first drain electrode 175a contacts the drain region 153 of the first semiconductor layer 154a through the first drain contact hole 162a. A second source electrode 173b contacts the source region 151 of the second semiconductor layer 154b through the second source contact hole 161b, and a second drain electrode 175b contacts the drain region 153 of the second semiconductor layer 154b through the second drain contact hole 162b. A third source electrode 173c contacts the source region 151 of the third semiconductor layer 154c through the third source contact hole 161c, and a third drain electrode 175c contacts the drain region 153 of the third semiconductor layer 154c through the third drain contact hole 162c.

The first source electrode 173a, the second source electrode 173b, and the third source electrode 173c do not completely cover the first source contact hole 161a, the second source contact hole 161b, and the third source contact hole 161c. Instead, the first source electrode 173a, the second source electrode 173b, and the third source electrode 173c only cover the portion of source region 151 of the first semiconductor layer 154a, the second semiconductor layer 154b, and the third semiconductor layer 154c respectively exposed through the first source contact hole 161a, the second source contact hole 161b, and the third source contact hole 161c. The first drain electrode 175a, the second drain electrode 175b, and the third drain electrode 175c do not completely cover the first drain contact hole 162a, the second drain contact hole 162b, and the third drain contact hole 162c, but only cover the portion of the drain region 153 of the first semiconductor layer 154a, the second semiconductor layer 154b, and the third semiconductor layer 154c respectively exposed through the first drain contact hole 162a, the second drain contact hole 162b, and the third drain contact hole 162c. Accordingly, the source offset groove d1 of the first to third semiconductor layers 154a, 154b, and 154c is completely exposed through a portion of the first to third source contact holes 161a, 161b, and 161c, and the drain offset groove d2 of the first to third semiconductor layers 154a, 154b, and 154c is completely exposed through a portion of the first to third drain contact holes 162a, 162b, and 162c.

Also, the first to third source electrodes 173a, 173b, and 173c are connected to each other, and the first to third drain electrodes 175a, 175b, and 175c are connected to each other. Accordingly, electrons may move through (or along) the channel region 152 of the first to third semiconductor layers 154a, 154b, and 154c such that the on current is increased.

Although in the third exemplary embodiment a plurality of semiconductor layers 154, a plurality of source electrodes 173, and a plurality of drain electrodes 175 are formed on one gate electrode 124, in other embodiments a plurality of semiconductor layers 154, a plurality of source electrodes 173, and a plurality of drain electrodes 175 may be formed on a plurality of gate electrodes 124 such that the on current is amplified. Accordingly, the decreasing of the on current by the source offset groove d1 and the drain offset groove d2 may be prevented. Next, a thin film transistor according to a fourth exemplary embodiment will be described with reference to FIG. 8.

Figure 8:
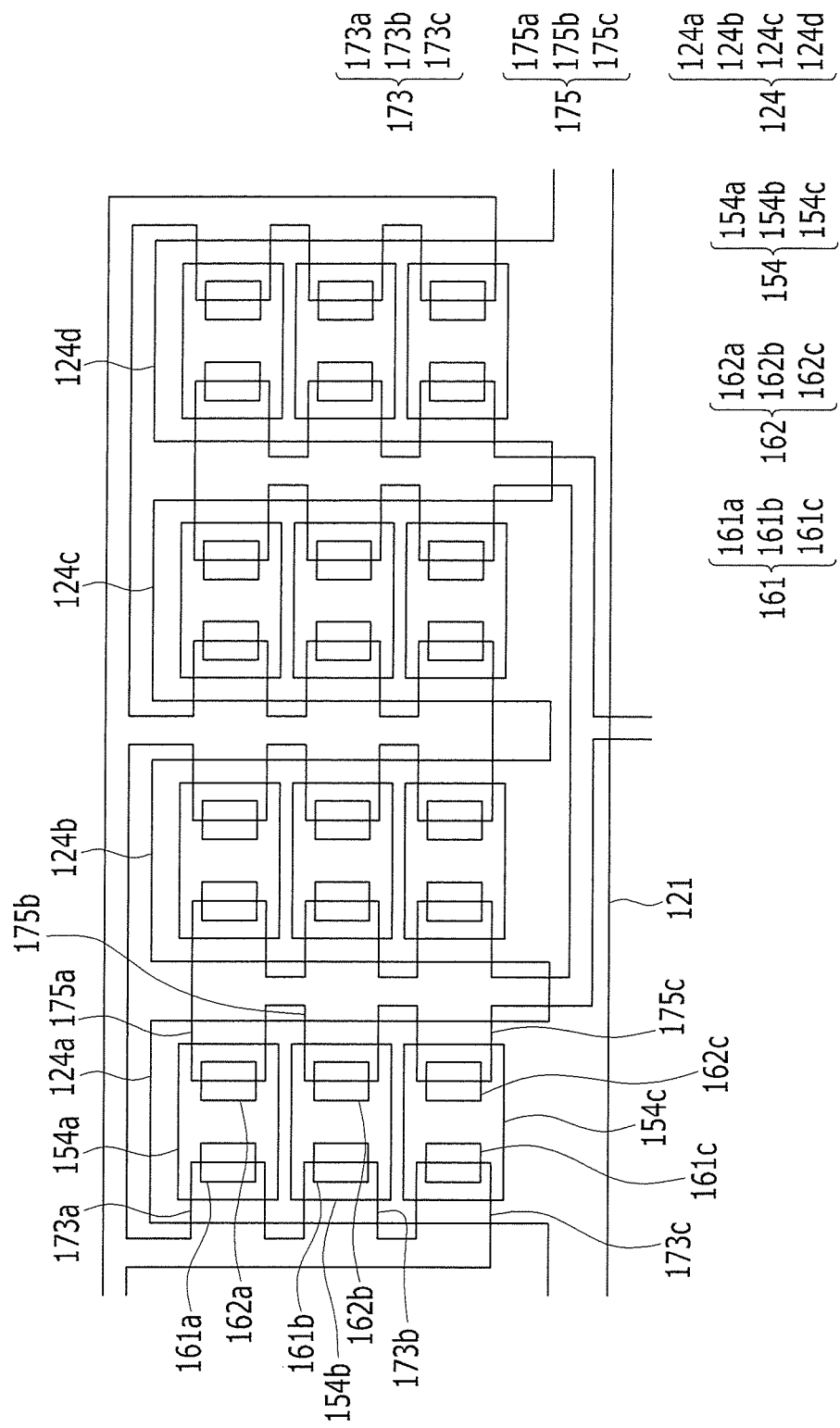
FIG. 8 is a layout view of a thin film transistor according to a fourth exemplary embodiment.

FIG. 8 is a layout view of a thin film transistor according to a fourth exemplary embodiment.

The fourth exemplary embodiment is substantially equivalent to the third exemplary embodiment shown in FIG. 7, except for a plurality of semiconductor layers 154, a plurality of source electrodes 173 and a plurality of drain electrodes 175 on a plurality of gate electrodes 124.

As shown in FIG. 8, in the thin film transistor according to the fourth exemplary embodiment, a plurality of gate electrodes 124 are formed on a substrate 110, and the plurality of gate electrodes 124 are connected through a gate line 121. The fourth exemplary embodiment shows four gate electrodes, however the number of gate electrodes is not limited thereto. The plurality of gate electrodes 124 include a first gate electrode 124a, a second gate electrode 124b, a third gate electrode 124c, and a fourth gate electrode 124d.

A plurality of semiconductor layers 154a, 154b, and 154c are formed on the first gate electrode 124a, and the plurality of semiconductor layers 154a, 154b, and 154c overlap the first gate electrode 124a. A protective layer 160 is formed on the plurality of semiconductor layers 154a, 154b, and 154c, and a gate insulating layer 140. The protective layer 160 has a plurality of source contact holes 161a, 161b, and 161c exposing the source region 151 and the source offset groove d1 of the plurality of semiconductor layers 154a, 154b, and 154c, and a plurality of drain contact holes 162a, 162b, and 162c exposing the drain region 153 and the drain offset groove d2 of the plurality of semiconductor layers 154a, 154b, and 154c. A plurality of source electrodes 173a, 173b, and 173c, and a plurality of drain electrodes 175a, 175b, and 175c are formed on the protective layer 160. The plurality of source electrodes 173a, 173b, and 173c contact the source region 151 of the plurality of semiconductor layers 154a, 154b, and 154c through the plurality of source contact holes 161a, 161b, and 161c, and the plurality of drain electrodes 175a, 175b, and 175c contact the drain region 153 of the plurality of semiconductor layers 154a, 154b, and 154c through the plurality of drain contact holes 162a, 162b, and 162c. Also, the plurality of source electrodes 173a, 173b, and 173c are connected to each other, and the plurality of drain electrodes 175a, 175b, and 175c are connected to each other. Accordingly, electrons may move through (or along) the channel region 152 of the plurality of semiconductor layers 154a, 154b, and 154c such that the on current is increased.

Also, in FIG. 8, the plurality of semiconductor layers 154a, 154b, and 154c; the plurality of source contact holes 161a, 161b, and 161c; the plurality of drain contact holes 162a, 162b, and 162c; the plurality of source electrodes 173a, 173b, and 173c; and the plurality of drain electrodes 175a, 175b, and 175c are formed on the second gate electrode 124b. However, the source electrodes 173a, 173b, and 173c and the drain electrodes 175a, 175b, and 175c formed on the second gate electrode 124b are located (or disposed) at positions opposite to the source electrodes 173a, 173b, and 173c and the drain electrodes 175a, 175b, and 175c formed on the first gate electrode 124a.

The plurality of source electrodes 173a, 173b, and 173c formed on the first gate electrode 124a are connected to the plurality of source electrodes 173a, 173b, and 173c formed on the second to fourth gate electrodes 124b, 124c, and 124d, and the plurality of drain electrodes 175a, 175b, and 175c formed on the first gate electrode 124a are connected to the plurality of drain electrodes 175a, 175b, and 175c formed on the second to fourth gate electrodes 124b, 124c, and 124d. Accordingly, electrons may move through (or along) the channel region 152 of the plurality of semiconductor layers 154a, 154b, and 154c such that the on current is increased.

While this disclosure has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims, and their equivalents.

<Description of Symbols>

| | | | |
|---|---|---|---|
| 124: | gate electrode | 140: | gate insulating layer |
| 154: | semiconductor layer | 160: | protective layer |
| 161: | source contact hole | 162: | drain contact hole |
| 173: | source electrode | 175: | drain electrode |
| d1: | source offset grooved | d2: | drain offset groove |

What is claimed is:

1. A thin film transistor comprising:
a substrate;
a gate electrode on the substrate;
a gate insulating layer covering the gate electrode;
a semiconductor layer corresponding to the gate electrode on the gate insulating layer;
a protective layer covering the semiconductor layer and the gate insulating layer and having a source contact hole and a drain contact hole exposing a portion of the semiconductor layer; and
a source electrode and a drain electrode on the protective layer and coupled to the semiconductor layer through the source contact hole and the drain contact hole, respectively,
wherein the semiconductor layer has a source offset groove at a portion corresponding to the source contact hole of the protective layer.

2. The thin film transistor of claim 1, wherein
the semiconductor layer comprises:
a source region contacting the source electrode,
a drain region contacting the drain electrode, and
a channel region between the source region and the drain region,
wherein the source offset groove separates the source region from the channel region.

3. The thin film transistor of claim 2, wherein
the semiconductor layer comprises a material selected from the group consisting of amorphous silicon, polysilicon, an oxide semiconductor, micro crystalline silicon, and laser crystallized silicon.

4. The thin film transistor of claim 2, wherein
the source contact hole exposes the source region and the source offset groove of the semiconductor layer.

5. The thin film transistor of claim 4, wherein
the source electrode covers a portion of the source contact hole.

6. The thin film transistor of claim 5, wherein
the drain electrode covers at least a portion of the drain contact hole.

7. The thin film transistor of claim 5, wherein
the width of the source offset groove is in a range of 1 μm to 10 μm.

8. The thin film transistor of claim 5, wherein
the semiconductor layer further comprises a drain offset groove at a portion corresponding to the drain contact hole of the protective layer.

9. The thin film transistor of claim 8, wherein
the drain offset groove separates the drain region from the channel region.

10. The thin film transistor of claim 9, wherein
the drain contact hole exposes the drain region and the drain offset groove of the semiconductor layer.

11. The thin film transistor of claim 10, wherein
the drain electrode covers a portion of the drain contact hole.

12. The thin film transistor of claim 11, wherein
the width of the drain offset groove is in a range of 1 μm to 10 μm.

13. A method for manufacturing a thin film transistor comprising:
   forming a gate electrode on a substrate;
   forming a gate insulating layer covering the gate electrode;
   forming a semiconductor layer on the gate insulating layer;
   forming a protective layer having a source contact hole and a drain contact hole exposing the semiconductor layer on the gate insulating layer and the semiconductor layer;
   forming a source electrode and a drain electrode coupled to the semiconductor layer through the source contact hole and the drain contact hole, respectively, on the protective layer; and
   etching the semiconductor layer exposed through the source contact hole to form a source offset groove.

14. The method of claim 13, wherein
the source electrode covers a portion of the source contact hole.

15. The method of claim 14, wherein
the source offset groove separates a source region from a channel region of the semiconductor layer.

16. The method of claim 15, wherein
the semiconductor layer exposed through the drain contact hole is etched to form a drain offset groove while forming the source offset groove.

17. The method of claim 16, wherein
the drain electrode covers a portion of the drain contact hole.

18. The method of claim 17, wherein
the drain offset groove separates a drain region from the channel region of the semiconductor layer.

19. A thin film transistor comprising:
   a substrate;
   at least one gate electrode on the substrate;
   a gate insulating layer covering the at least one gate electrode;
   a plurality of semiconductor layers corresponding to the at least one gate electrode on the gate insulating layer and separated from each other;
   a protective layer covering the plurality of semiconductor layers and the gate insulating layer and having a plurality of source contact holes and a plurality of drain contact holes exposing the plurality of semiconductor layers; and
   a plurality of source electrodes and a plurality of drain electrodes on the protective layer and coupled to the plurality of semiconductor layers through the plurality of source contact holes and the plurality of drain contact holes,
   wherein the plurality of semiconductor layers have a plurality of source offset grooves and a plurality of drain offset grooves at positions corresponding to the plurality of source contact holes and the plurality of drain contact holes, respectively, of the protective layer.

20. The thin film transistor of claim 19, wherein
the plurality of source electrodes are coupled to each other, and the plurality of drain electrodes are coupled to each other.

21. The thin film transistor of claim 20, wherein
a plurality of the at least one gate electrodes comprises gate electrodes that are coupled to each other through a gate line.

22. The thin film transistor of claim 21, wherein
each of the plurality of semiconductor layers comprises:
   a source region contacting a corresponding one of the source electrodes,
   a drain region contacting a corresponding one of the drain electrodes, and
   a channel region between the source region and the drain region,
   wherein each of the source offset grooves separates the source region from the channel region, and each of the drain offset grooves separates the drain region from the channel region.

23. The thin film transistor of claim 22, wherein
each of the source contact holes exposes the source region and a corresponding one of the source offset grooves of a corresponding one of the semiconductor layers, and each of the drain contact holes exposes the drain region and a corresponding one of the drain offset grooves of the corresponding one of the semiconductor layers.

24. The thin film transistor of claim 23, wherein
each of the source electrodes covers a portion of a corresponding one of the source contact holes, and each of the drain electrodes covers a portion of a corresponding one of the drain contact holes.

* * * * *